United States Patent [19]
Geisler et al.

[11] Patent Number: 5,173,640
[45] Date of Patent: Dec. 22, 1992

[54] APPARATUS FOR THE PRODUCTION OF A REGULAR MICROWAVE FIELD

[75] Inventors: Michael Geisler, Wächtersbach; Michael Jung, Kahl; Bernhard Kessler, Hanau-Wolfgang, all of Fed. Rep. of Germany

[73] Assignee: Leybold Aktiengesellschaft, Hanau, Fed. Rep. of Germany

[21] Appl. No.: 792,409

[22] Filed: Nov. 15, 1991

[30] Foreign Application Priority Data

Nov. 22, 1990 [DE] Fed. Rep. of Germany ....... 4037091

[51] Int. Cl.$^5$ .............................................. H05H 1/46
[52] U.S. Cl. ........................... 315/111.21; 315/111.41; 313/231.31; 204/298.38
[58] Field of Search ....................... 315/111.21, 111.41, 315/111.81; 313/231.31; 204/298.38, 298.37

[56] References Cited

U.S. PATENT DOCUMENTS

| | | | |
|---|---|---|---|
| 2,566,386 | 9/1951 | Varian | 178/44 |
| 2,996,715 | 8/1961 | Rumsey et al. | 343/767 |
| 4,006,339 | 2/1977 | Maurer | 219/10.55 F |
| 4,476,352 | 10/1984 | Kusunoki et al. | 219/10.55 F |
| 4,512,868 | 4/1985 | Fujimura et al. | 204/298 |
| 4,543,465 | 9/1985 | Sakudo et al. | 315/111.41 X |
| 4,745,337 | 5/1988 | Pichot et al. | 315/111.81 X |
| 4,767,641 | 8/1988 | Kieser et al. | 315/111.21 X |
| 4,866,346 | 9/1989 | Gaudreau et al. | 315/111.21 |
| 4,906,900 | 3/1990 | Asmussen | 315/111.81 |
| 4,985,109 | 1/1991 | Otsubo et al. | 156/345 |
| 4,992,665 | 2/1991 | Möhl | 315/111.81 X |
| 5,021,919 | 6/1991 | Engemann | 315/111.41 X |
| 5,053,678 | 10/1991 | Koike et al. | 315/111.41 X |

FOREIGN PATENT DOCUMENTS

| | | |
|---|---|---|
| 0183561 | 6/1986 | European Pat. Off. |
| 0285020 | 10/1988 | European Pat. Off. |
| 0286132 | 10/1988 | European Pat. Off. |
| 0382065 | 8/1990 | European Pat. Off. |
| 2716592 | 10/1977 | Fed. Rep. of Germany |
| 2900617 | 8/1979 | Fed. Rep. of Germany |
| 3530647 | 3/1987 | Fed. Rep. of Germany |
| 248904 | 8/1987 | Fed. Rep. of Germany |
| 3622614 | 1/1988 | Fed. Rep. of Germany |
| 263648 | 1/1989 | Fed. Rep. of Germany |
| 2312165 | 5/1976 | France |
| 2520160 | 1/1982 | France |
| 2489647 | 3/1982 | France |
| 363742 | 8/1962 | Switzerland |
| 368248 | 3/1963 | Switzerland |
| 370177 | 6/1963 | Switzerland |
| 654224 | 6/1951 | United Kingdom |

OTHER PUBLICATIONS

Journal of Vacuum Science and Technology, Part A, Vol. 8, No. 2, Feb. 1990, New York, pp. 908–915, M. Geisler et al.: "Elongated microwave electron cyclotron resonance heating plasma source".

Jacobsen, S. et al.: An Antenna Illuminated by a Cavity Resonator, in: Proc. of the IEEE, Nov. 1963, pp. 1431–1435.

Patent Abstracts of Japan, E-570, Jan. 7, 1988, vol./12-/No. 3, publication No. 62-165,403.

E. Pehl: Mikrowellentechnik, vol. 2, Antennen und aktive Bauteile, 2nd Ed., 1989, p. 79 ff.

G. Leitungs-und Hohlraumresonateren, p. 477.

Primary Examiner—Eugene R. LaRoche
Assistant Examiner—Do Hyun Yoo
Attorney, Agent, or Firm—Felfe & Lynch

[57] ABSTRACT

The invention relates to an apparatus for the production of a regular microwave field over a comparatively great area. This apparatus has a cavity resonator into which microwaves are put. Electromagnetic energy is coupled by special couplers, inductively or capacitively, out of the standing waves forming in the cavity resonator into a chamber in which preferably a plasma is contained.

22 Claims, 6 Drawing Sheets

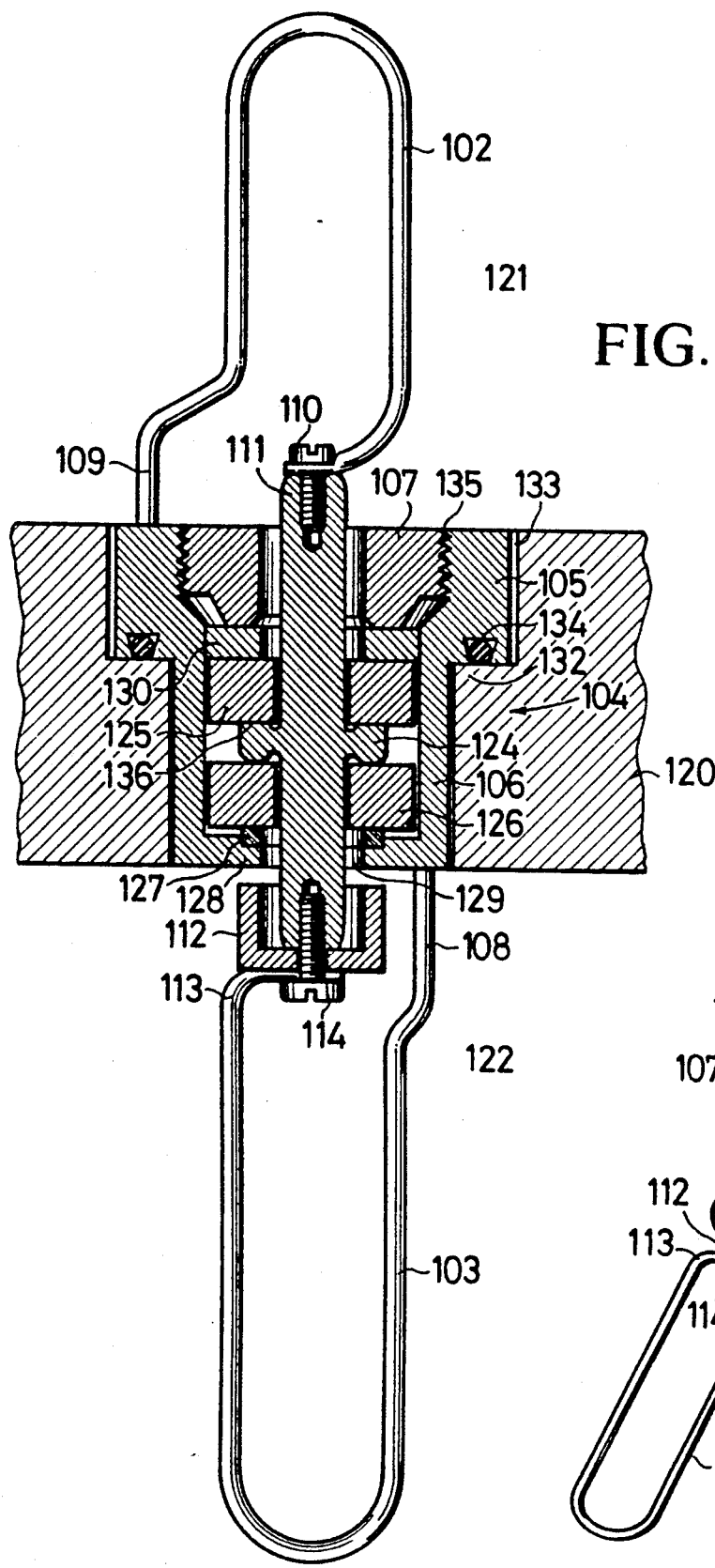
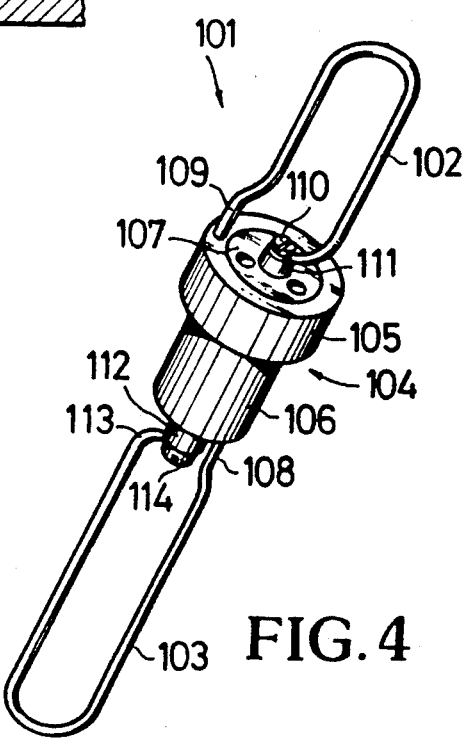
FIG.5
FIG.4

APPARATUS FOR THE PRODUCTION OF A REGULAR MICROWAVE FIELD

DESCRIPTION

The invention relates to an apparatus in accordance with the introductory part of claim 1.

BACKGROUND OF THE INVENTION

In the production of plasmas, which are used for coating materials and other purposes, microwaves are increasingly being used, which in conjunction with magnetic fields produce an electron cyclotron resonance and hence a heightened ionization of atoms or molecules. Of special interest are those plasma sources which are configured very uniformly and over a great breadth so that many small or a few large areas can be coated simultaneously. In particular, plasma-enhanced chemical deposition from the gas phase, called PCVD(=plasma enhanced chemical vapor deposition), which is used as an alternative or supplement to the known sputtering or vapor depositing technique in large-area coating, requires a very uniform low-pressure plasma, at least in the direction of the greatest reach of the coating apparatus.

A microwave broad-beam ion source is known, in which the microwaves are fed through an $E_{01}$ round waveguide to an $E_{010}$ cavity resonator which is surrounded by a magnet coil and filled with the gas to be ionized (DD Pat. 248 904). The bottom of the cavity resonator forms an emission electrode which, together with an extraction electrode, forms an extraction system to which a vacuum chamber is connected. It is a disadvantage of this ion source that the microwave energy is not radiated uniformly by the round hollow waveguide into the cavity resonator. Since the round hollow waveguide is smaller than the cavity resonator, the microwaves radiate only in a relatively small range.

To regularize large-area microwave injections, cavity resonator antennas are known, which have round or rectangular openings in the resonator (Jacobsen, S. et. al.: An Antenna Illuminated by a Cavity Resonator, in: Proc. of the IEEE, November 1963, pp. 1431 to 1435, DE-A-35 30 647), or slits (GB-A-654,224, U.S. Pat. No. 2,996,715, DE-C-29 00617, U.S. Pat. No. 4,512,868, Swiss Patents 370,177, 368,248, 363,742, Patent Abstracts of Japan, E-570, Jan. 7, 1988, Vol. 12/No. 3, publication No. 62-165,403) or quartz windows (EP-A-0 183 561, EP-A-0 286 132). A transfer of electromagnetic energy from the cavity resonator into a spatially separate plasma chamber, however, is not possible with these known apparatus.

A plasma etching apparatus is known, which has a microwave generator which is coupled to a rectangular waveguide (DE-C-27 16 592, FIG. 1). In a position which is about ¼th of a waveguide wavelength from the end of this rectangular waveguide, the end of the inner conductor of a coaxial waveguide extends into the hollow waveguide. Through the antenna formed in this manner the microwave of the waveguide is propagated also in the coaxial waveguide. Furthermore, an electrical field of microwaves propagates itself through an insulator as well as a coupling device between the microwaves and the plasma in a discharge current. The hollow waveguide which is in communication with the microwave generator is not a cavity resonator. Furthermore, only one inner conductor is provided and is looped directly through the dividing wall between the hollow waveguide and the discharge current.

Lastly, an apparatus is also known for producing microwave plasmas of great breadth and regularity, which has a microwave generator, a cavity resonator, a coupling to couple the microwave generator to the cavity resonator, a chamber defined by walls, a dividing wall between the cavity resonator and the chamber, and a coupling system consisting of a plurality of coupling elements in the form of solid bodies (DD-A-263,648). The coupling elements in this case are metal coupling hooks which extend out of the waveguide carrying the microwave into another waveguide adjoined by a plasma chamber. An important component of this known microwave plasma supply is the line terminated by a matched absorber, which connects or couples the coupling elements arranged in a row on the vacuum side and plasma side, respectively. This coupling constitutes a disadvantage because the individual microwave antennas should be as uncoupled from one another as much as possible, not coupled together. The coupling of the antennas on the plasma side defeats the decoupling that is achieved by supplying the antennas from a resonator of high quality. Around the individual antennas areas of intense plasma form, in which the electron density reaches its critical level of $0.75 \times 10^{-12}$ cm$^{-3}$ which is critical to its excitation frequency. This means that a great part of the power fed into the antenna on the vacuum side by the plasma is completely reflected.

SUMMARY OF THE INVENTION

The invention is addressed to the problem of creating an apparatus with microwave couplers which makes it possible to radiate microwaves as uniform fields into a chamber of large area, the microwave couplers being uncoupled relative to one another in this chamber.

This problem is solved in accordance with the features of claim 1. Moreover, several parallel or colinear cavity resonators preferably are provided which are fed through a feed resonator by coherent magnetrons.

The advantage achieved by the invention consists especially in the fact that it results in a great regularity of the near field of the microwave injection antenna. An especially stable and uniform near field distribution results in the case of resonator lengths up to 1 meter and longer, and discharge pressures equal to or greater than 1 Pa. In conjunction with a plasma chamber this regularity leads to a uniformity of the plasma distribution. Plasma zone lengths whcih are greater than 1 m can easily be achieved with the invention. Likewise, for incandescent discharges such as are commonly used in PCVD technology, microwave power densities on the order of 4 W/cm$^2$ can be irradiated.

Furthermore, the invention does not require a dielectric component that might become coated by the plasma or other sources contained in the tank. With the invention it is also possible to feed in several individual microwave sources in parallel.

Also, with the invention a decoupling of the antennas on the plasma side is achieved by the fact that they are given, for example, a bend toward the magnet system situated sufficiently close to them, this magnet system preferably fulfilling the conditions of electron-cyclotron resonance (ECR). The magnet system and antennas are so arranged with respect to one another that the antennas radiate very directly into the plasma forming on or over the magnet system. On the basis of the ECR effect, a considerable amount of the electromagnetic radiation is absorbed before it penetrates into the vicinity of the neighboring antenna and thus produces a decoupling of the neighboring antenna.

Embodiments of the invention are represented in the drawing and are further described hereinbelow.

DESCRIPTION OF A PREFERRED EMBODIMENT

Figure 1:
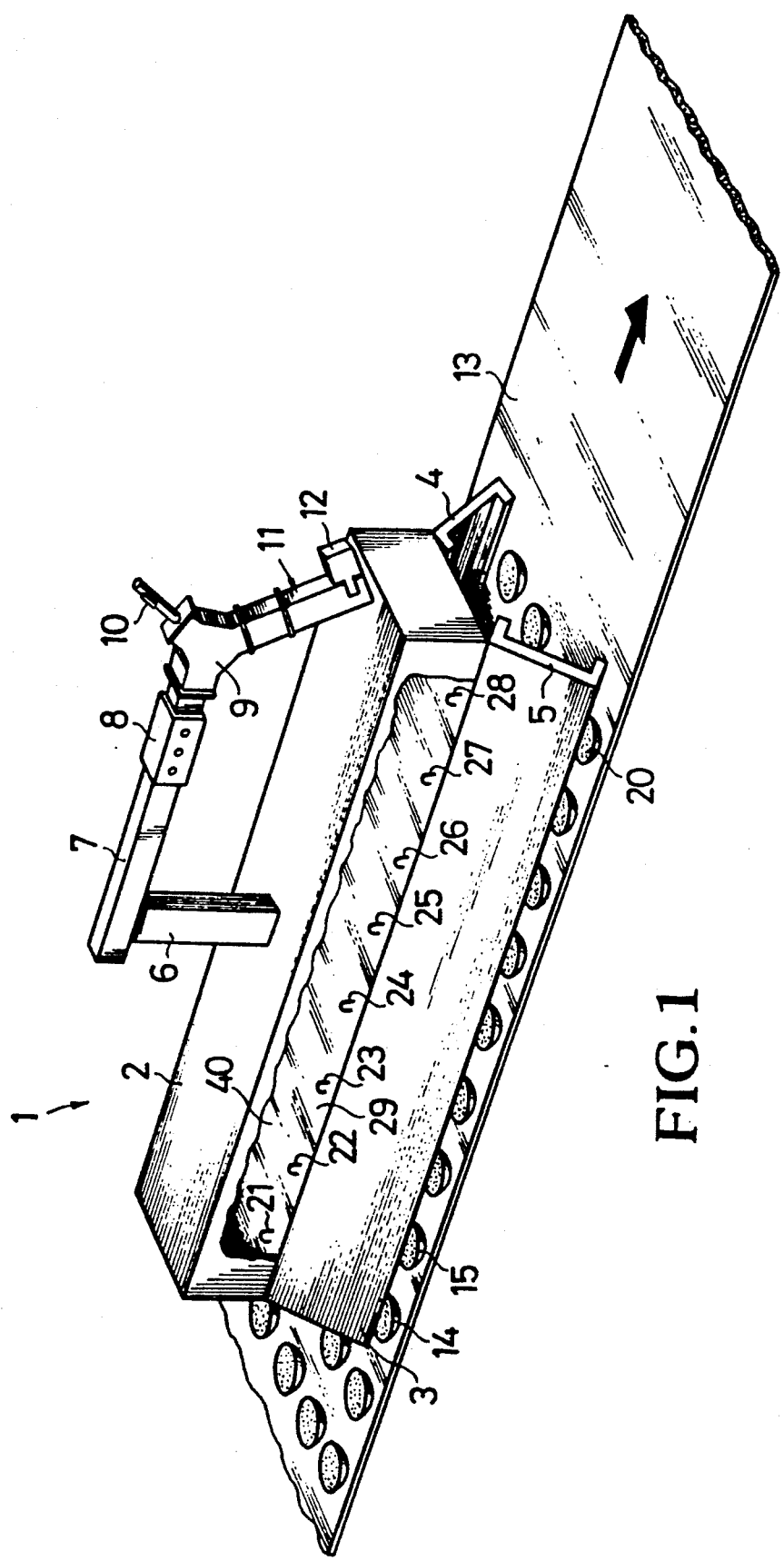
FIG. 1 shows the principle of a microwave injection into a cavity resonator with microwave neutralization.

In FIG. 1 the principle of a coating apparatus 1 is represented, which has an air-filled cavity resonator 2 for microwaves, a vacuum plasma chamber 3 with magnet yokes 4 and 5 bearing permanent magnets, and a rectangular waveguide 6 for the injection of microwaves. The rectangular waveguide 6 is connected to an additional rectangular waveguide 7 which in turn is connected through an impedance transformer 8 to a circulator 9. The circulator 9 has a matching resistance 10—here represented symbolically—which can be a matched absorber and a power meter, and is connected by a connecting piece 11 to a microwave generator 12, for example a magnetron tube. The working frequency of the microwave generator 12 is, for example, 2.45 GHz or 915 MHz.

Underneath the plasma chamber there is provided a conveyor belt 13 on which a plurality of objects 14 to 20 are disposed for coating. Elements essential to the invention are numerous wave couplers 21 to 28 disposed in line, which can be seen in the cut-away area 40 of the resonator 2, and which reach with an upper part into the rectangular waveguide 6 and with a lower part into the plasma chamber 3. These wave couplers 21 to 28 couple microwave energy from the cavity resonator 2 through a solid metal wall 29 into the plasma chamber 3.

Figure 2A:
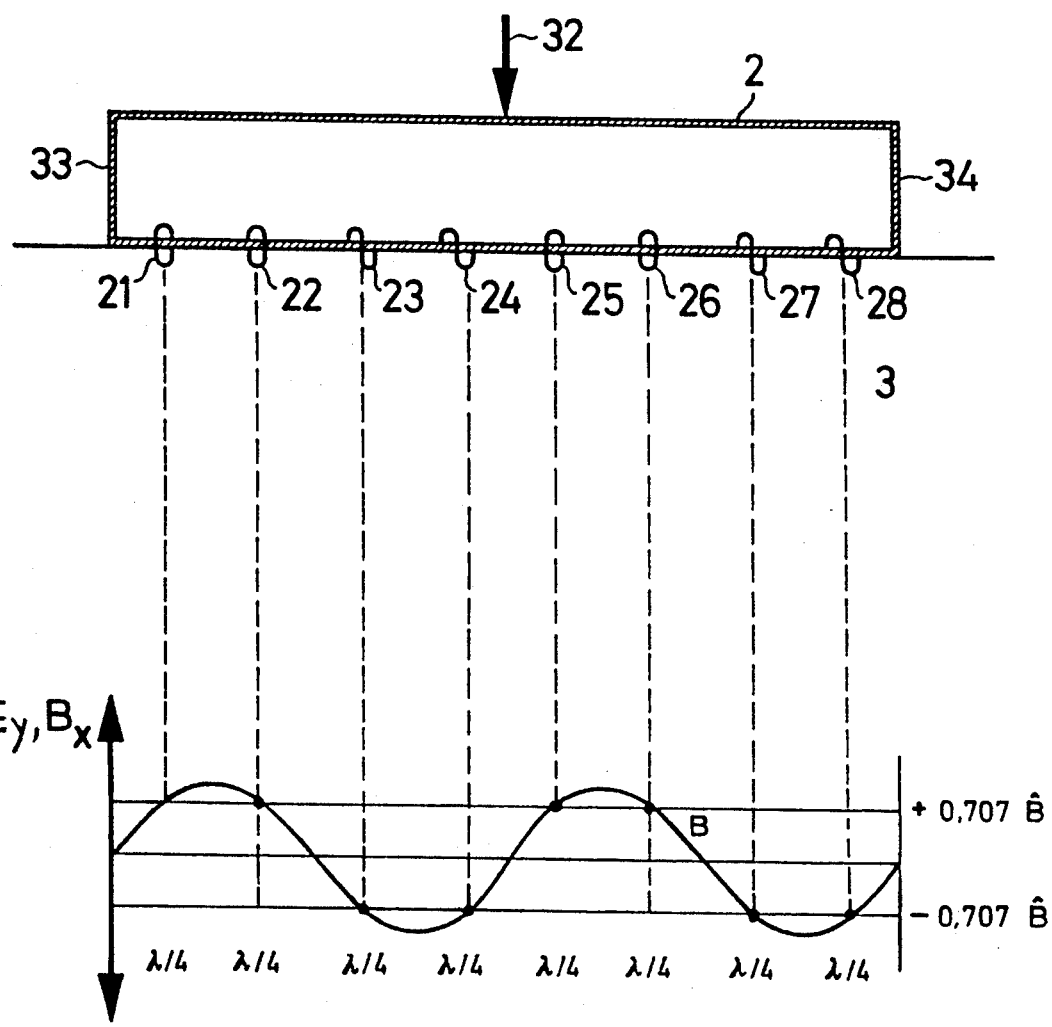
FIG. 2a shows a cavity resonator with a number of neutralizing elements, FIG. 2b a representation of the field or fields that form in the cavity resonator according to FIG. 2a, FIG. 3 a section through the cavity resonator and a plasma chamber, FIG. 4 a perspective view of an inductive coupling element, FIG. 5 a sectional view of the inductive coupling element according to FIG. 4, FIG. 6 an arrangement with a hollow waveguide resonator having top and bottom coupling elements, FIG. 7 an arrangement in which the coupling elements are between permanent magnets of unlike polarity.
Figure 2B:
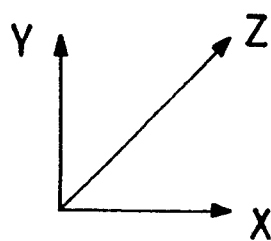

In FIG. 2a the cavity resonator 2 is again represented schematically. While air is preferably present in this cavity resonator 2, a vacuum is present underneath the resonator 2, i.e., in the plasma chamber 3. The injection of the microwave energy into the cavity resonator is indicated by an arrow 32.

Underneath the cavity resonator 2 are represented the standing E and B fields which form between the side walls 33 and 34 of the resonator 2. The resonator consists in this case, for example, of a rectangular tube 1 m long. At one end it can have a short-circuiting plate, not shown, and at the other end a short-circuiting slide, not shown. With this slide the resonance frequency can be adjusted. The dimensions of the resonator 2 alone determine the field pattern at a given frequency and dielectric constant, and thereby the resultant resonant frequency. The sinusoidal B and E field is tapped capacitively and inductively at the positive and negative 0.707 values of the sine half-waves. Thus there are preferably two taps per half-wave. At the same time the positive half-wave is tapped differently than the negative half-wave so as to obtain a phase rotation. For the inductive tapping, for example, a first coupling segment 21, 22, is provided at the positive half-wave, while for the negative half-wave a second coupling segment 23, 24, is provided. The positions of the coupling elements 21 to 28 coincide with the points where the amplitude of the electrical or magnetic alternating field has 0.7 times its maximum, so that all couplers 21 to 28 put out the same field strength amplitude and power.

Although this arrangement is especially advantageous, the invention nevertheless is not limited to it. The couplers can rotate the coupled field also by a phase of any desired degree, so that they do not have to be disposed a quarter wavelength apart. Also the coupling damping does not have to be the same.

In the preferred embodiment the couplers are so disposed that the centers between any two like couplers have the same longitudinal coordinates as the ends of the standing wave within the resonator 2. Couplers 21 to 28 carry the microwave energy from the cavity resonator 2, which contains air, into the plasma or vacuum chamber 3. In the case of inductive coupling they can therefore be considered as a kind of transformers. Couplers 21 to 28 couple the microwave energy out of a standing wave in the cavity resonator and couple it back into the plasma chamber capacitively or inductively.

Due to the equidistant and linear arrangement of the couplers, which preferably also have the same attenuation, a roughly even wave-front is established, derived from the Huygens principle, according to which the appropriate superimposition of the waves of numerous punctiform wave generator results in a flat wave. While a single punctiform wave generator produces a spherical wave, the superimposition of numerous spherical waves results in a flat wave if the distance between the wave generators is much less than $\lambda/2$.

Such a flat wave is radiated by the various couplers 21 to 28, which are to be considered as point sources, onto the plasma chamber 3, so that a regular and uniform useful field results. Couplers 21 to 28 act in their totality like an antenna radiating a flat wave. The layout of the antennas has a certain relationship to the phased array antennas as they are known in radar technology (cf. E. Pehl: *Mikrowellentechnik*, vol. 2, *Antennen und aktive Bauteile*, 2nd ed., 1989, p. 79 ff.).

To bring about the phase reversal in the inductive output of the negative half-wave in comparison to the positive half-wave, the winding sense of an output loop can be changed. Since the magnetic lines of force in the waveguide have a different direction in every other phase, the current induced in a loop flows in a different direction. If the loops are brought out of the waveguide differently according to the particular half-wave, the currents will flow all in the same direction.

Figure 3:
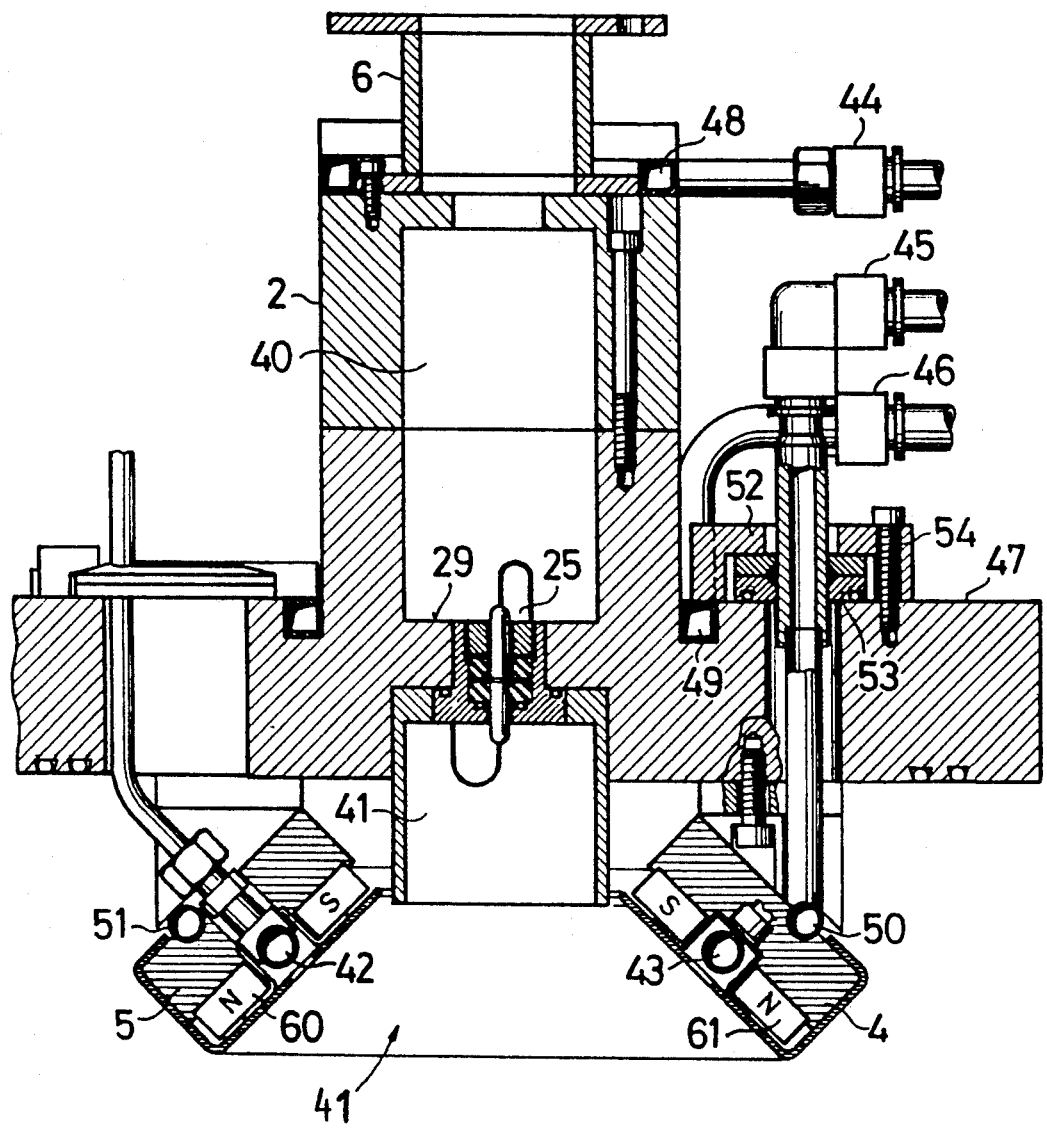

In FIG. 3 there is shown a section through a cavity resonator 2 and a plasma chamber 3. A plasma chamber 41 is shown, into which microwave energy from a microwave source not represented is fed through the waveguide 6. The standing wave that forms in the interior 40 of the cavity resonator 2 is coupled into the interior 41 of the plasma chamber 3 through the couplers 21 to 28 of which only one coupler 25 is seen in FIG. 3. In this interior, furthermore, a gas or gas mixture is fed through tubes 42 and 43 to be ionized. The ionization is caused not only by the entering microwaves but also by the magnetic fields which are produced by the magnet systems 4 and 5 with the permanent magnets 60 and 61. By the interaction of the microwave with the appropriately sized magnetic fields, an electron-cyclotron resonance is created, which enhances the ionization. The plasma chamber 3, the magnet systems 4 and 5, and also the resonator 2, heat up during operation, so that they have to be cooled. For this purpose a water cooling system is provided, whose cooling tubes 44 to 46 run to cooling rings 48 to 51. A flange 47 bearing tube guides 52 and 54 and gaskets 53 is provided on the plasma chamber 3 for the attachment of the cooling tube 45 leading to the magnet systems 4 and 5. A coupling loop not shown in FIG. 3 is provided from the rectangular waveguide 6 to the cavity resonator 2.

In FIGS. 4 and 5 is shown a device for coupling a high microwave power from a first chamber into a second chamber, in which an optical transparent medium between two chambers is unnecessary, and in which overheating and disadvantageous coating of the coupling means are prevented.

The advantage gained with this apparatus consists especially in the fact that the couplers and/or the wall between the two chambers are only very slightly heated. Furthermore, contamination of the coupler in the plasma chamber and the ignition of a discharge in the vacuum lead-through between the primary and secondary part of the coupler is prevented.

FIG. 4 shows a coupling element 101 in accordance with the invention, which has a primary antenna 102 and a secondary antenna 103. Between the two antennas is a bushing 104 having an upper part 105 of great outside diameter and a lower part 106 of small outside diameter. The upper bushing 105 is closed by a threaded plug 107 whose male thread engages a female thread of part 105 of bushing 104.

The primary antenna 102 and the secondary antenna 103 are in the form of an open loop, one end 108, 109 of the loops being affixed to the bushing 104. The other end of the loop of the primary antenna 102 is fastened by a screw 110 to one end of a center electrode 111, while the other end of this center electrode 111 is connected to a dark space cap to which the other end 113 of the secondary antenna 103 is connected. The connection between the dark space cap 112, secondary antenna 103 and center electrode 111 is provided by a screw 114.

The coupling element 101 represented in FIG. 4 can be inserted individually or together with several similar coupling elements in a dividing wall between a plasma chamber and a microwave chamber.

In FIG. 5 the coupling element 101 of FIG. 4 is again shown in section, this coupling element 101 being inserted into a dividing wall 120. Above the dividing wall 120, i.e., in chamber 121, there is air, for example, while in chamber 122 below the dividing wall 120 a plasma is present. A microwave is propagated into chamber 121, which is a cavity resonator for example, preferably as a standing wave. Microwave energy is coupled by the primary antenna 102 from this standing wave into the plasma in chamber 122.

The two antennas 102 and 103 are connected to one another by a center electrode 111 which is in the form of a pin having a collar 124 approximately in its middle. Above and below this collar 124 ceramic disks 125 and 126 are disposed, the lower ceramic disk 126 being held through a gasket 127 on the bottom 128 of the bushing 104, which has an opening 129.

Above the upper ceramic disk 125 a compression washer 130 is provided, above which is a threaded plug 107 whose male thread engages the female thread of the upper part 105 of the bushing 104. The upper part 105 of the bushing rests on a projection 132 of a bore 133 in the dividing wall 120 with an elastomer seal 134. The seal between the atmosphere in chamber 121 and the vacuum in chamber 122 is provided essentially by the elements 124, 126, 127 and 128. The ceramic disk 125 serves for the transfer of force and for insulation between the center electrode 111 and the compression washer 130. The compression washer 130, which is made of soft metal, such as silver, copper or aluminum, is pressed into the substantially harder surface of the ceramic disk 125, which results in a very intense surface contact between the compression washer 130 and the surface of the ceramic disk. With a connection of this kind, sealing systems can be produced with a leakage rate decidedly lower than $10 \times 10^{-8}$ mb l/s for helium.

The pressing force acting on the compression washer 130, whose outside diameter is oversized in relation to bore 135 in bushing 104, is first forced in by means of a device. If the threaded plug 107 is further tightened, the combination of metal washer 130, lower ceramic disk 126, collar 124 of the middle electrode 111, the upper ceramic disk 125 and the compression washer 130 is drawn tight. As the torque applied to threaded plug 107 is further increased, first the deformation at the sealing edge 136 of the collar 124 against the middle electrode 111 takes place. As tightening increases, the metal gasket 127 is also deformed. The surface stress in the packet composed of metal gasket 127, lower ceramic disk 126, middle electrode 111, upper ceramic disk 125 and compression washer 130 is designed so that only at the sealing surfaces does deformation of the metal surfaces take place in the described order.

For the ceramic disks 125 and 126, disks of $Al_2O_3$ are used, which has a thermal conductivity $\lambda$ that is about ten times lower than the thermal conductivity $\lambda$ of the middle electrode 111. In order to assure a reliable removal of the amount of heat which the cross section of the middle electrode 111 of metal can transfer, a correspondingly large area on the ceramic disks 125, 126 must be utilized for heat transfer. This area is made available by the collar 124 of the middle electrode 111, since the top and bottom of collar 124 are in good, large-area contact with the ceramic disks 125 and 126.

The removal of heat above and below the ceramic disks 125 and 126 is performed on the one hand by the compression washer 130 and on the other hand by the metal gasket 127. The compensation of the slightly different thermal expansion properties of the materials of electrode 111 and sealing rings 130, 125, 126 and 127 on the one hand and of the material of bushing 104 on the other is established by the ratio between the thickness of the collar 124 of the middle electrode 111 and the thickness of the ceramic disks 125 and 126. Any possible shifting of the sealing surfaces against one another due to different thermal expansion of the ceramic-to-metal connection is prevented by a pronounced toothing combined with high pressing forces acting on these surfaces. The compression washer 130 can also be made as a spring, e.g., from copper beryllium, in order to assure the tightening forces even after considerable overloading of the coupler 101.

The outside diameter of the compression washer 130 is increased by the pressing. In this manner a secure and technically useful contact is created between the outer margin of the compression washer 130 and the inside wall of the bushing 104. The compression washer 130 therefore acts from the microwave technology viewpoint as the bottom of the bushing 104. The elastomer seal 134 by which the sealing of the coupling element 101 against the separating wall 120 is accomplished, is shielded against microwave fields by a metal cassette formed by a sealing groove on the bushing 104 and a sealing surface 132 on the dividing wall 120, and is therefore protected against destruction. At the same time this screw-tightened metallic contact of the bushing 104 serves for the transfer of heat.

By means of the coupling element 101 the inside and outside diameter of the coaxial lead-through in the dividing wall 120 can be varied within wide limits. For example, the diameter of the middle electrode 111, its collar 124, the diameter of the ceramic disks 125 and 126, the bores in the threaded plug 107 or in the bottom of the bushing 104 can be selected such that a wave impedance can be associated with the coaxial lead-through. The electrical length of the coaxial lead-through amounts preferably to $\lambda/2$.

The dark-space cap 112 consists of metal material and is configured so that it prevents the penetration of charge carriers from the plasma into the isolation gap of the coaxial lead-through. In this manner the sustaining of a non-independent discharge in the isolation gap is prevented. Furthermore, by maintaining the dark-space distance the gaps between the coupling element 101 and the dividing wall 120 are of such dimensions that even an independent discharge within a wide range of pressures cannot exist. The dark-space cap 112 also lastingly prevents the coating or contamination of the coupling element 101. The top 105 and bottom 106 of the coupling element 101 can easily be cleaned by mechanical cleaning methods, e.g., by brushing, blasting with glass beads, etc. The pot shape or bell shape of the dark-space cap 112 has also proven good from the viewpoint of microwave technology.

Both the primary antenna 102 and the secondary antenna 103 can be configured as H loops with $l/\lambda < <1$, $l$ being the developed length of the antenna loop, and as a ring antenna or folded dipole antenna with $l/\lambda \approx > 1$, or also as capacitive coupling pins. Preferably the antennas 102 and 103 are ring antennas. At the same time both the ascending and the descending part of the antenna are to have no very great bends and are to be as parallel as possible in their length. The feet of the antennas 102 and 103 can be screwed in, soldered, welded or clamped. Radii and lengths, i.e., the geometry of the antennas 102 and 103 are selected such that, in the area of the dark-space cap 112 and largely also in the adjoining portion of the coupling element 101, the voltages on the antennas and on the middle electrode are low.

The coupling attenuation between the waveguide resonator symbolized by the space 121 and a PCVD reactor symbolized by the space 122 can be controlled by the size of the primary antenna 102 or also by its orientation relative to the axis of the waveguide resonator.

Figure 6:
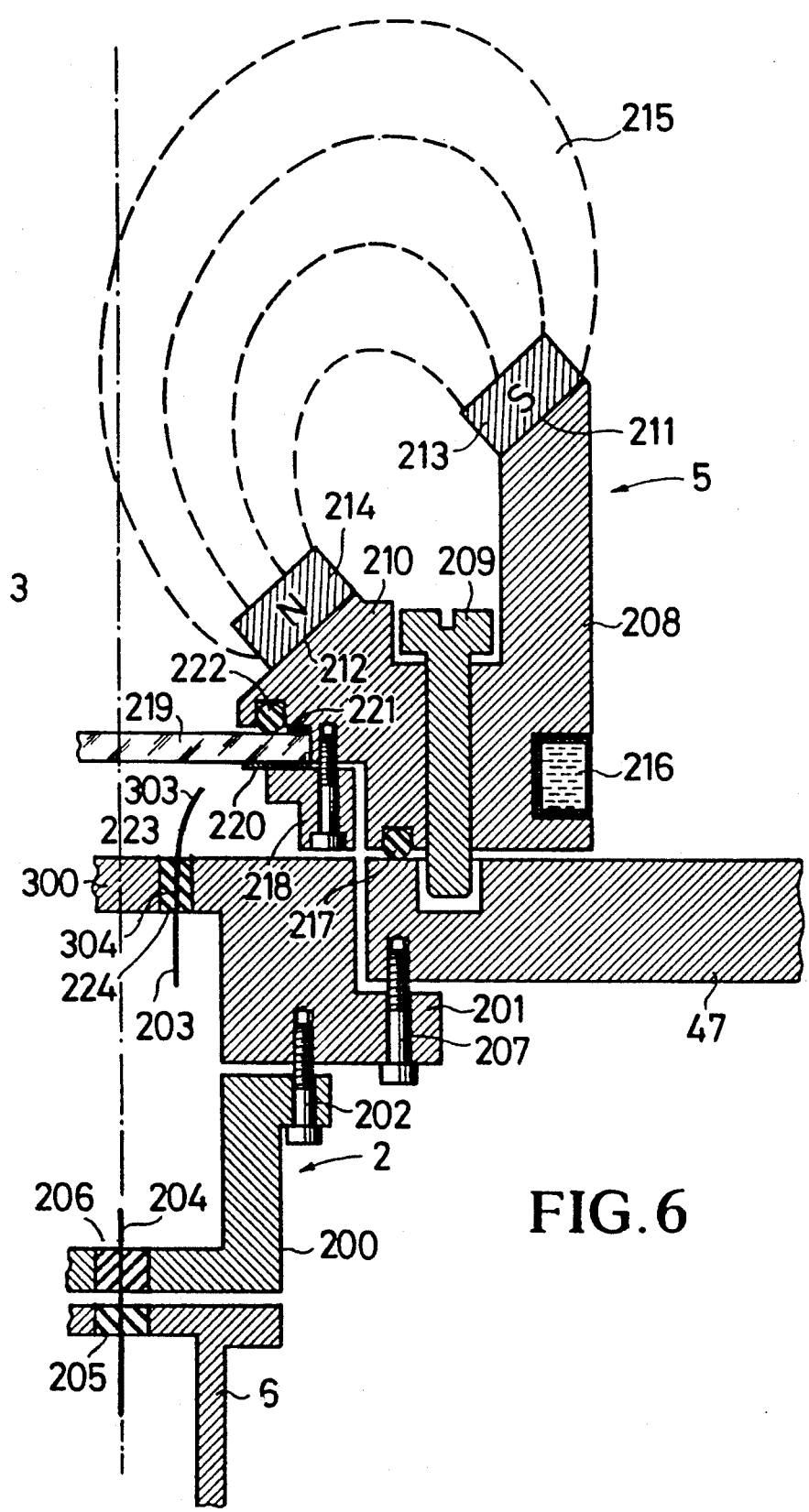

In FIG. 6 is shown a fragmentary cross section through a cavity resonator 2 which is comparable with the view in FIG. 3 if the latter is rotated 180. The cavity resonator 2 consisting of a metal material has in this case two halves 200 and 201 which can be joined together by the fastening means 202. In the upper half a number of coupling loops have been introduced, of which only one coupling loop 203 can be seen in FIG. 6. These coupling loops are disposed one behind the other into the plane of drawing. An individual coupling loop has about the appearance of a coupling loop 25 in FIG. 3, but the two stems of the loop are disposed perpendicular to the plane of drawing.

The lower half 200 of the cavity resonator 2 has, in a manner similar to the upper half 201, coupling loops of which only coupling loop 204 is visible in FIG. 6. These coupling loops couple electromagnetic energy from the rectangular waveguide 6 consisting of metal material, to which a microwave transmitter, not shown, is connected, into the cavity resonator 2. The coupling loops 204 are brought through electrically nonconductive seals 205 and 206. The upper half 201 of the cavity resonator 2 and the flange 47 of the plasma chamber 3 are fastened together by fastening means 207. Likewise, a soft iron yoke 5 is joined to this flange 47 by fastening means such as screws 209. This soft iron yoke 5 has an outer limb 208 and an inner limb 210, the outer limb 208 being larger than the inner limb 210 and both limbs 208 and 210 having a surface 211 and 212, respectively, with a 45 degree inclination, which are aligned with one another. The surface 211 of the larger limb 208 bears a south pole 213 of a permanent magnet, while the surface of the smaller limb 210 bears the corresponding north pole 214. 215 indicates the magnetic lines of force between the north pole 214 and the south pole 213. A rectangular cooling tube 216 is integrated into the outer limb 208. On the bottom of the smaller limb 210 a vacuum seal 217 is provided. Between the bottom part of the small limb 210 on the one hand and the top of the upper half 201 of the cavity resonator 2 on the other there is provided a clamp 218 on which a glass or ceramic plate rests. Between this plate 219 and the clamp 218 is a graphite slip 220. Another graphite slip 221 is provided between the top of the plate 219 and a bottom edge of the smaller limb 210. This film 221 is followed, toward the plasma chamber 3, by a vacuum seal 222 which can consist of metal, Calriz or Viton. The plate 219 and the top of the cavity resonator 2 form a chamber 223 into which microwave energy is injected through the couplers 203 which are brought through electrically nonconducting materials 224 into the cavity resonator 2.

In the arrangement according to FIG. 6 the couplers 203 on the plasma side are behind the quartz or ceramic plate 219 and can thus be operated independently of influences from the plasma chamber 3.

In the arrangement according to FIG. 6 the advantage is obtained that the antennas can be more easily oriented to the resonance range of the magnetic field, the direction of propagation of the energy and the direction of the B field, i.e., the direction of the magnetic field of the permanent magnet, are the same.

Figure 7:
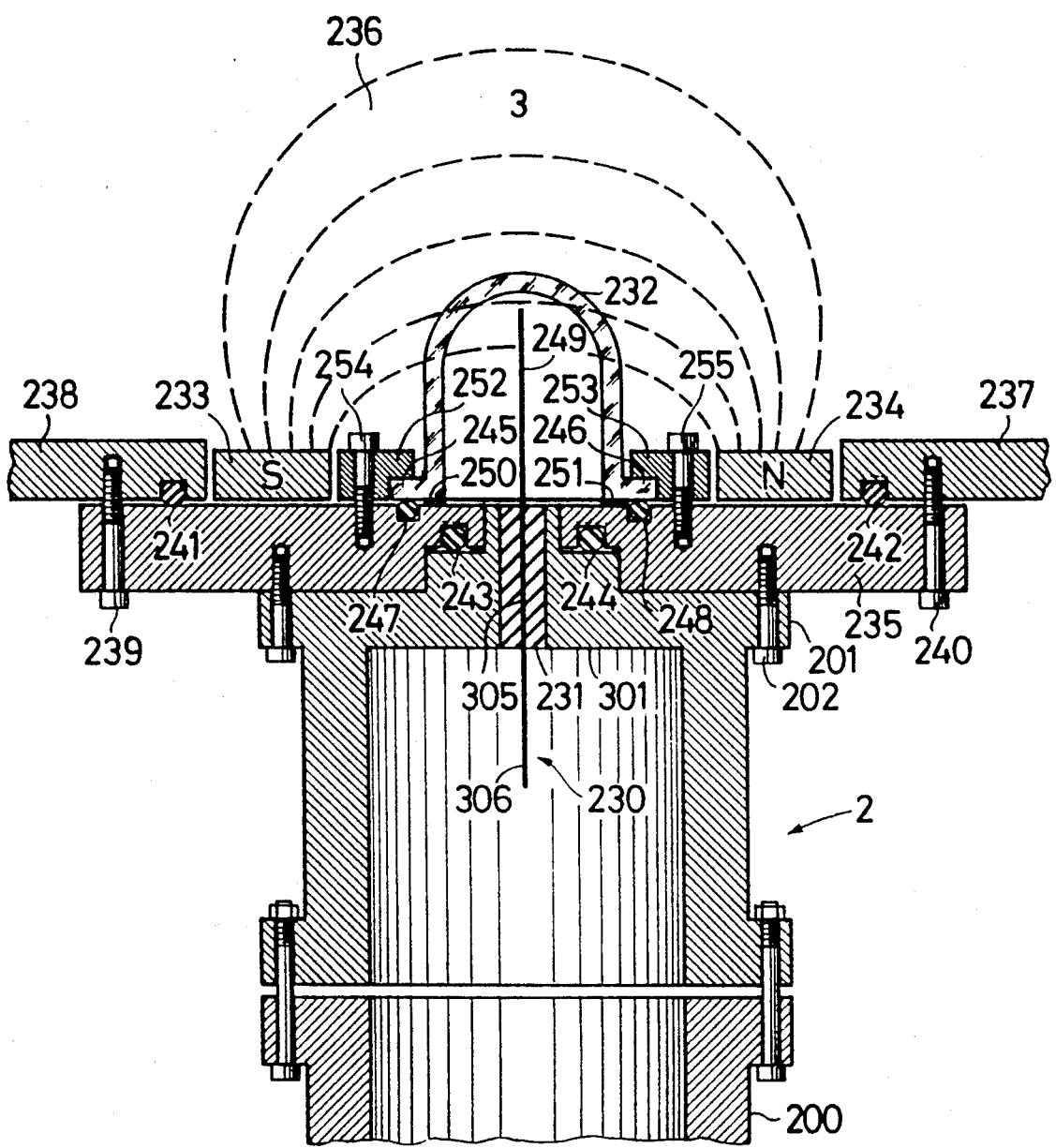

FIG. 7 shows another variant of the invention, in which a plurality of looped couplers 230 are disposed side by side in the cavity resonator 2 and enter the plasma chamber 3 through electrically nonconductive seals 231. Over each coupler 230 is placed a quartz or ceramic dome 232. These domes 232 are between a south pole 233 and a north pole 234 of a permanent magnet which is attached to a soft iron yoke 235 which lies on top of the cavity resonator 2. The magnetic lines of force running between the north and south poles are identified as 236. The soft iron yoke 235 extends over the entire surface of the cavity resonator 2 and bears at its ends the walls 237 and 238 of the plasma chamber 3 which are merely indicated in FIG. 7. Between the tank walls 237 and 238 and the soft iron yoke 235 there is a mechanical fastening by means of screws 239 and 240. Also, seals 241 and 242 are provided between the yoke 235 and the nonmagnetic tank walls 237 and 238. Additional seals 243 and 244 are situated in the middle part of the top of the cavity resonator 2 and the bottom of the yoke 235 as well as between the top of the yoke 235 and lateral flanges 245 and 246 at the bottom end of a dome 232. These last seals are identified by 247 and 248. Between the part 249 of a coupler 230 reaching into the dome and the seals 247 and 248 a graphite plate 250-251 is also provided on the bottom of the dome 232.

The flanges 245 and 246 are held fast by nonmagnetic clamps 252 and 253 which are attached to the soft iron yoke 235 by screws 254 and 255.

In the arrangement according to FIG. 7 these couplers 230 lie between the permanent magnet poles 233 and 234 of opposite polarity. In this manner each rectilinear acceleration path of an electron is supplied from a cavity resonator. It is also possible to supply both poles of the permanent magnets from a ring resonator.

We claim:

1. Apparatus for the production of a regular microwave field over a relatively great area, comprising:
   a microwave generator including a magnetron;
   a cavity resonator;
   a means of coupling the microwave generator to the cavity resonator;
   a plasma chamber defined by walls;
   a gas introduction means into the plasma chamber;
   a dividing wall of electrically conductive material between the cavity resonator; and the chamber; and
   a coupling system consisting of a plurality of coupling elements in the form of solid bodies, which couples electromagnetic energy from the cavity resonator into the chamber;
   characterized in that
   the dividing wall separates the cavity resonator gastight from the chamber;
   in the cavity resonator first elements are provided as primary elements of the coupling elements which can absorb the electromagnetic energy from the cavity resonator;
   in the chamber second elements are provided as secondary elements of the coupling elements, which can yield the electromagnetic energy into the chamber; and
   in the dividing wall through-bores having electrically nonconducting closures are provided, electrically conductive connections passing through these closures and to connect the first elements to the respective second elements.

2. Apparatus according to claim 1 characterized in that the coupling elements comprising the respective first and second element are disposed equidistantly.

3. Apparatus according to claim 1, characterized in that the coupling elements comprising the respective first and second element are disposed linearly and at a distance apart of $\lambda/4$, $\lambda$ being the wavelength of a standing wave forming in the cavity resonator.

4. Apparatus according to claim 3, characterized in that the coupling elements comprising the respective first and second elements are inductive couplers which couple the electromagnetic energy out of the standing wave in the cavity resonator and couple it back into the plasma chamber inductively.

5. Apparatus according to claim 3, characterized in that the coupling elements comprising the respective first and second elements are capacitive couplers which couple the electromagnetic energy out of the standing wave in the cavity resonator and couple it back into the plasma chamber capacitively.

6. Apparatus according to claim 1, characterized in that several cavity resonators are provided are connected together through a feed resonator and are supplied each with the same electromagnetic energy.

7. Apparatus according to claim 1, characterized in that several cavity resonators disposed in parallel are provided, which are fed by coherent magnetrons.

8. Apparatus according to claim 1, characterized in that several cavity resonators disposed colinearly are provided, which are fed by coherent magnetrons.

9. Apparatus according to claim 8, characterized in that the magnetrons emit different frequency but equal power.

10. Apparatus according to claim 1, characterized in that the microwave coupling elements which couple out of a negative half-wave of a standing wave have a phase reversal with respect to the microwave coupling elements which couple out of a positive half-wave of the standing wave.

11. Apparatus according to claim 1, characterized in that the chamber is defined by a container which is surrounded lengthwise by magnet systems which produce a cusp field in the chamber, which in cooperation with the injected microwave produces an electron-cyclotron resonance.

12. Apparatus according to claim 1, characterized in that the wavelength of a standing wave building up in the cavity resonator is regulated through the gas pressure prevailing and adjustable in the chamber.

13. Apparatus according to claim 1, characterized in that a dark-space cap is situated in the plasma chamber and in the vicinity of each electrically conductive connection.

14. Apparatus according to claim 1, characterized in that each of the primary elements of the coupling elements is comprised of a primary antenna which has essentially the form of an open loop, one end of this open loop being connected with the respective electrically conductive connection, while the other end of this loop is connected with a bushing which is brought through the dividing wall between the cavity resonator and the chamber.

15. Apparatus according to claim 1, characterized in that each of the secondary elements of the coupling elements is comprised of a secondary antenna which has essentially the form of an open loop, one end of this open loop being connected through a dark-space cap with the respective electrically conductive connection, while the other end of this loop is connected with a bushing which is brought through the dividing wall between the cavity resonator and the chamber.

16. Apparatus according to claim 1, characterized in that each electrically conductive connection is a pin which has an annular collar.

17. Apparatus according to claim 1, characterized in that the dividing wall as well as the coupling elements consist of nonmagnetic materials.

18. Apparatus according to claim 1, characterized in that between the chamber and the cavity resonator a wall a plate permeable to microwaves is provided, which forms between the plate and the cavity resonator a space into which the secondary elements of the coupling elements reach.

19. Apparatus according to claim 18, characterized in that above the plate and at its margin the north and south poles of a permanent magnet are disposed at an angle of about 45 degrees.

20. Apparatus according to claim 18, characterized in that a first series of couplers is provided which couple microwave energy from the coupling means into the cavity resonator.

21. Apparatus according to claim 1, characterized in that each secondary element in the chamber is provided with a roof which consists of a material which blocks gases and solids and admits microwaves.

22. Apparatus according to claim 1, characterized in that each secondary element is disposed between the north pole and the south pole of a permanent magnet.

* * * * *

UNITED STATES PATENT AND TRADEMARK OFFICE
CERTIFICATE OF CORRECTION

PATENT NO. : 5,173,640

DATED : December 22, 1992

INVENTOR(S) : Michael Geisler et al

It is certified that error appears in the above-identified patent and that said Letters Patent is hereby corrected as shown below:

Column 11, lines 5-6 for "a wall a plate"

read -- a plate --.

Signed and Sealed this

Twenty-ninth Day of March, 1994

*Attest:*

BRUCE LEHMAN

*Attesting Officer*     *Commissioner of Patents and Trademarks*